(12) United States Patent
Abesingha et al.

(10) Patent No.: US 7,388,437 B2
(45) Date of Patent: Jun. 17, 2008

(54) SYSTEM AND METHOD FOR TUNING A FREQUENCY SYNTHESIZER

(75) Inventors: Buddhika J. Abesingha, Frisco, TX (US); Timothy M. Magnusen, Murphy, TX (US); Jan-Michael Stevenson, Frisco, TX (US); Robert A. Greene, Plano, TX (US)

(73) Assignee: Microtune (Texas), L.P., Plano, TX (US)

( * ) Notice: Subject to any disclaimer, the term of this patent is extended or adjusted under 35 U.S.C. 154(b) by 180 days.

(21) Appl. No.: 11/325,781

(22) Filed: Jan. 4, 2006

(65) Prior Publication Data

US 2007/0155343 A1 Jul. 5, 2007

(51) Int. Cl.
*H03L 7/07* (2006.01)
*H03L 7/097* (2006.01)
(52) U.S. Cl. .................. 331/11; 331/14; 331/16; 331/44
(58) Field of Classification Search .............. 331/11, 331/14, 16, 44
See application file for complete search history.

(56) References Cited

U.S. PATENT DOCUMENTS 6,097,777 A * 8/2000 Tateishi et al. ............. 375/376
7,099,643 B2 * 8/2006 Lin ........................... 455/255

* cited by examiner

*Primary Examiner*—Robert J. Pascal
*Assistant Examiner*—James Goodley
(74) *Attorney, Agent, or Firm*—Baker Botts L.L.P.

(57) ABSTRACT

An apparatus for generating an output signal having a particular frequency includes an oscillator, a first tuning module, and a second tuning module. The oscillator generates an output signal associated with an output frequency. When coupled to the oscillator, the first tuning module is capable of inducing, within a first amount of time, a change in the output frequency of a particular magnitude. When coupled to the oscillator, the second tuning module is capable of inducing, within a second amount of time, a change in the output frequency of the same magnitude. The second amount of time is greater than the first amount of time. The selector couples a selected one of the first tuning module and the second tuning module to the oscillator based on a difference between a frequency-divided version of the output signal and a reference signal.

15 Claims, 4 Drawing Sheets

SYSTEM AND METHOD FOR TUNING A FREQUENCY SYNTHESIZER

TECHNICAL FIELD OF THE INVENTION

This invention relates, in general, to frequency synthesizers and, more particularly, to a method and system for quickly tuning a frquency synthesizer.

BACKGROUND OF THE INVENTION

Many radio-frequency (RF) communication systems transmit information within multiple frequency ranges, or "channels," of the RF spectrum simultaneously. Because such RF communication systems transmit information by modulating RF carrier signals with the information to be transmitted, devices receiving the modulated RF signals will often need to downconvert such signals so that the original information can be processed as part of a baseband signal. Mixers and/or similar components are used in many communication systems to perform this downconversion.

Mixers typically downconvert RF signals by mixing the RF signal with a tuning signal having a frequency equal to the frequency of the RF carrier signal on which the information was transmitted. As a result, RF receivers often include frequency synthesizers capable of generating tuning signals having frequencies of the same magnitude as the carrier signals which the RF receiver will be receiving. Because many RF communication systems utilize several different carrier frequencies to transmit information, RF receivers in such systems must be able to generate tuning signals of varying frequencies.

SUMMARY OF THE INVENTION

In accordance with the present invention, the disadvantages and problems associated with frequency synthesizers have been substantially reduced or eliminated. In particular, a frequency synthesizer with improved tuning capabilities is provided.

In accordance with one embodiment of the present invention, an apparatus for generating an output signal having a particular frequency includes an oscillator, a first tuning module, and a second tuning module. The oscillator generates an output signal associated with an output frequency. When coupled to the oscillator, the first tuning module is capable of inducing, within a first amount of time, a change in the output frequency of a particular magnitude. When coupled to the oscillator, the second tuning module is capable of inducing, within a second amount of time, a change in the output frequency of the same magnitude. The second amount of time is greater than the first amount of time. A selector couples a selected one of the first tuning module and the second tuning module to the oscillator based on a difference between the divided signal and a reference signal.

In accordance with another embodiment of the present invention, a method for generating an output signal having a particular frequency includes receiving information indicating a divisor associated with a requested frequency and generating, at an oscillator, an output signal. The output signal is associated with an output frequency. The method further includes generating a divided signal, wherein the divided signal is associated with a frequency equal to the output frequency divided by a divisor and selectively coupling at least one of a first tuning module and a second tuning module to the oscillator based, at least in part, on a difference between the divided signal and a reference signal.

Furthermore, with respect to this method, the first tuning module is capable, when coupled to the oscillator, of inducing changes in the output frequency of a particular magnitude within a first amount of time and the second tuning module is operable, when coupled to the oscillator, to induce changes in the output frequency of the same magnitude within a second amount of time. The second amount of time is greater than the first amount of time.

Important technical advantages of certain embodiments of the present invention include improved techniques for quickly tuning a frequency synthesizer. Additional technical advantages of certain embodiments include lower power consumption under certain operation circumstances. Other technical advantages of the present invention will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE INVENTION

Figure 1:
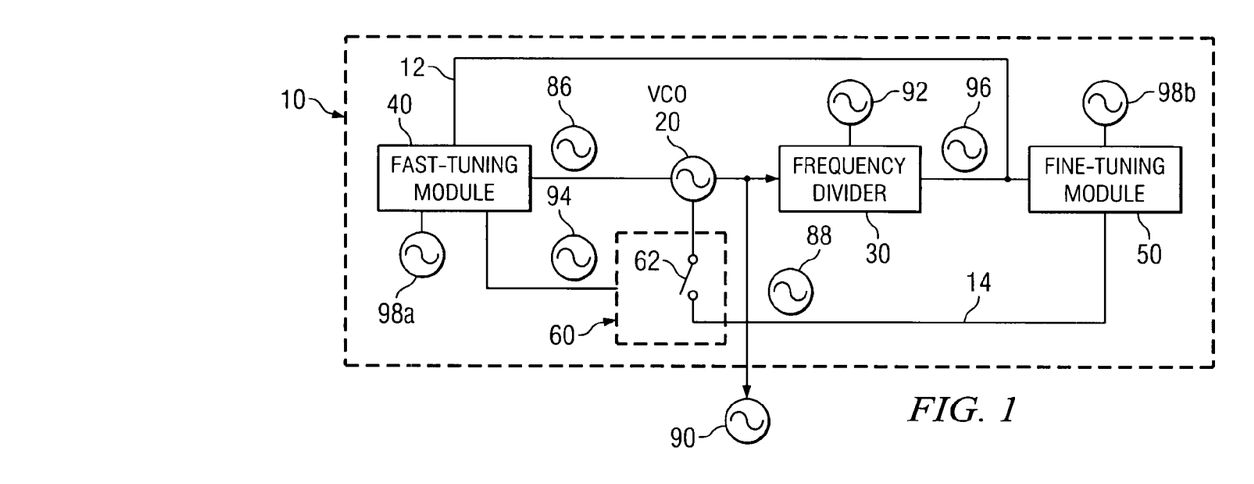
FIG. 1 illustrates a frequency synthesizer.

FIG. 1 is a block diagram illustrating functional components of a particular embodiment of a frequency synthesizer 10 capable of generating an output signal 90 having a specific frequency. As shown, frequency synthesizer 10 includes an oscillator 20, a frequency divider 30, a fast-tuning module 40, a fine-tuning module 50, and a selector 60. Fast-tuning module 40 and fine-tuning module 50, when coupled to oscillator 20, are capable of inducing changes in the frequency of output signal 90 generated by oscillator 20. Moreover, by selectively coupling fast-tuning module 40 and/or fine-tuning module 50 to oscillator 20 through the operation of selector 60, particular embodiments of frequency synthesizer 10 may be capable of tuning to a specific frequency more quickly than is possible in particular types of conventional frequency synthesizers.

Oscillator 20 generates a periodic signal having a frequency that may be set based in part on a fast-tuning control signal 86 and/or a fine-tuning control signal 88 that may be received by oscillator 20. In particular embodiments, oscillator 20 may represent a voltage-controlled oscillator (VCO) capable of receiving fast-tuning control signal 86 and/or fine-tuning control signal 88 and adjusting the frequency of output signal 90 based on a value associated with the received fast-tuning control signal 86 and/or fine-tuning control signal 88. This value may represent a voltage, a current level, or any other characteristic of an analog or digital signal. In general, however, oscillator 20 may include any appropriate components suitable to provide the described functionality. The contents and operation of a particular embodiment of oscillator 20 are described in greater detail below with respect to FIG. 5.

Frequency divider 30 receives output signal 90 and generates a divided signal 96 having a frequency that is equal to the frequency of output signal 90 divided by some divisor. In particular embodiments, frequency divider 30 may receive information (shown in FIG. 1 as a "divisor selection signal 92") indicating the appropriate divisor by which to divide the frequency of output signal 90. Frequency divider 30 may receive this information from any other appropriate element of frequency synthesizer 10 or from other components coupled to frequency synthesizer 10. For example, in particular embodiments, frequency divider 30 may receive divisor selection signal 92 from a user interface (not shown) by which a user of a device that incorporates frequency synthesizer 10 may select a channel to which to tune the device. Furthermore, the information received by frequency divider 30 may indicate the relevant divisor in any appropriate manner. As one example, in particular embodiments, divisor selection signal 92 may explicitly specify an appropriate divisor to frequency divider 30. As another example, in particular embodiments, divisor selection signal 92 may indicate a requested channel or frequency to be tuned, and frequency divider 30 may be responsible for determining the appropriate divisor to use based on the requested channel.

Fast-tuning module 40 controls the frequency of output signal 90 by transmitting fast-tuning control signal 86 to oscillator 20. More specifically, fast-tuning module 40 is responsible for making relatively coarse adjustments to the frequency of output signal 90 using techniques and/or components that are capable of inducing the relevant changes more quickly than changes induced by fine-tuning module 50. In particular embodiments, fast-tuning module 40 may be coupled to oscillator 20 by a dedicated connection, as shown in FIG. 1. In alternative embodiments, fast-tuning module 40 may be connected to oscillator 20 through a selective connection. For example, with appropriate modifications to the configuration and components of frequency synthesizer 10, fast-tuning module 40 may be coupled to oscillator 20 through an element similar to selector 60 that selectively couples fast-tuning module 40 to oscillator 20. In general, fast-tuning module 40 may include any appropriate components suitable to provide the described functionality. The contents and operation of a particular embodiment of fast-tuning module 40 are described in greater detail below with respect to FIG. 3.

Fine-tuning module 50, when coupled to oscillator 20, controls the frequency of output signal 90 by transmitting fine-tuning control signal 88 to oscillator 20. More specifically, fine-tuning module 50 is responsible for making relatively finer adjustments to the frequency of output signal 90 using techniques and/or components that may result in the changes induced by fine-tuning module 50 taking effect more slowly than those induced by fast-tuning module 40. In particular embodiments, fine-tuning module 50 is coupled to oscillator by a selective connection, such as through selector 60 in FIG. 1. In alternative embodiments, fine-tuning module 50 may be connected to oscillator 20 through a dedicated connection with appropriate modifications to the configuration and components of frequency synthesizer 10. In general, fine-tuning module 50 may include any appropriate components suitable to provide the described functionality. The contents and operation of a particular embodiment of fine-tuning module 50 are described in greater detail below with respect to FIG. 4.

Selector 60 selectively couples fine-tuning module 50 to oscillator 20. Selector 60 may receive appropriate control signals from fast-tuning module 40 (such as those shown in FIG. 1 as "selection control signals 94"), fine-tuning module 50, and/or any other appropriate element of frequency synthesizer 10. Selector 60 may include any appropriate components suitable to provide the described functionality. For example, in particular embodiments, selector 60 includes a switch 62 operable to form and break a conductive connection between fine-tuning module 50 and oscillator 20.

In operation, frequency synthesizer 10 generates an output signal 90 having a specific frequency. More specifically, frequency synthesizer 10 receives information indicating a requested frequency for output signal 90. As noted above, in particular embodiments, frequency divider 30 receives divisor selection signal 92 that indicates a divisor by which frequency divider 30 is to divide the frequency of output signal 90. Frequency divider 30 also receives a copy of output signal 90 from oscillator 20. Frequency divider 30 generates and outputs a divided signal 96 having a frequency equal to the frequency of the output signal 90 divided by the appropriate divisor.

In particular embodiments, fast-tuning module 40 or another appropriate element of frequency synthesizer 10 is configured to transmit selection control signals 94 to selector 60 to configure selector 60 so that selector 60 selectively couples fine-tuning module 50 to oscillator 20. For example, in the illustrated embodiment, fast-tuning module 40 transmits an appropriate selection control signal 94 to selector 60 whenever frequency synthesizer 10 receives a new divisor selection signal 92. Selector 60 then configures switch 62, based on the received selection control signals 94, to terminate a connection between oscillator 20 and fine-tuning module 50.

Additionally, fast-tuning module 40 begins adjusting the frequency of the signal output by oscillator 20. Fast-tuning module 40 may continue to adjust the frequency of output signal 90 until fast-tuning module 40 determines that the frequency of output signal 90 is within a predetermined range of the requested frequency. For example, in particular embodiments, as described in greater detail below with respect to FIG. 3, fast-tuning module 40 may induce changes by adjusting the capacitance associated with oscillator 20. In particular embodiments, fast-tuning module 40 is capable of inducing relatively large changes in the frequency of output signal 90.

Figure 2:
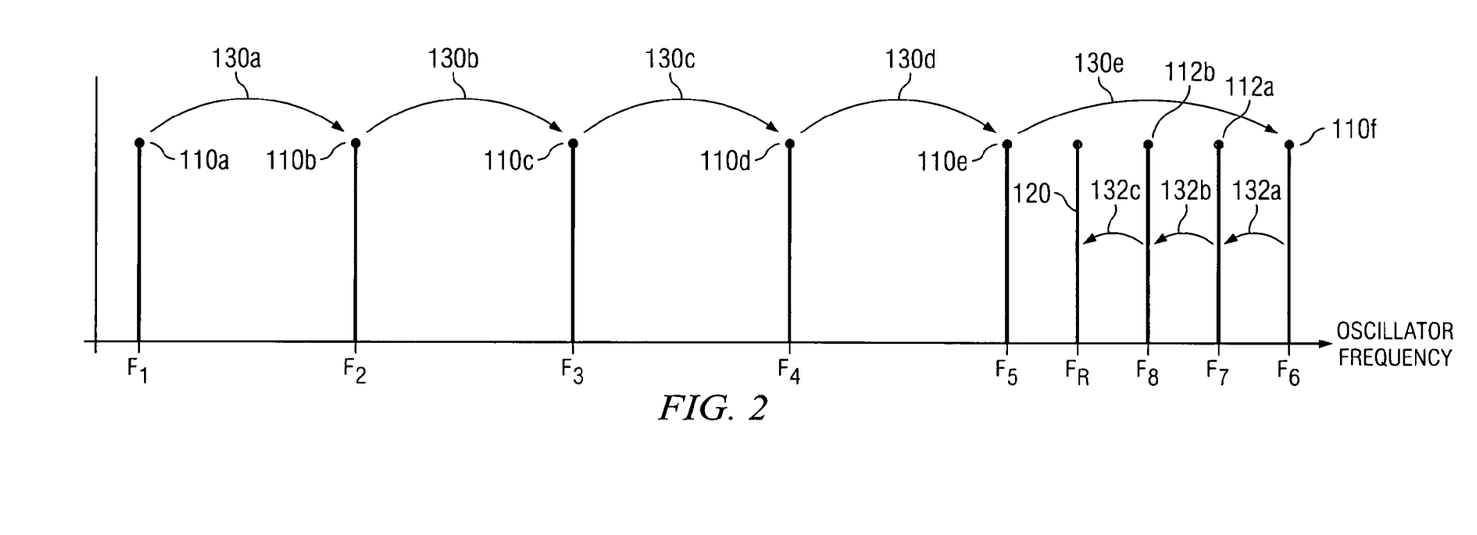
FIG. 2 illustrates operation of the frequency synthesizer of FIG. 1 during tuning.
Figure 3:
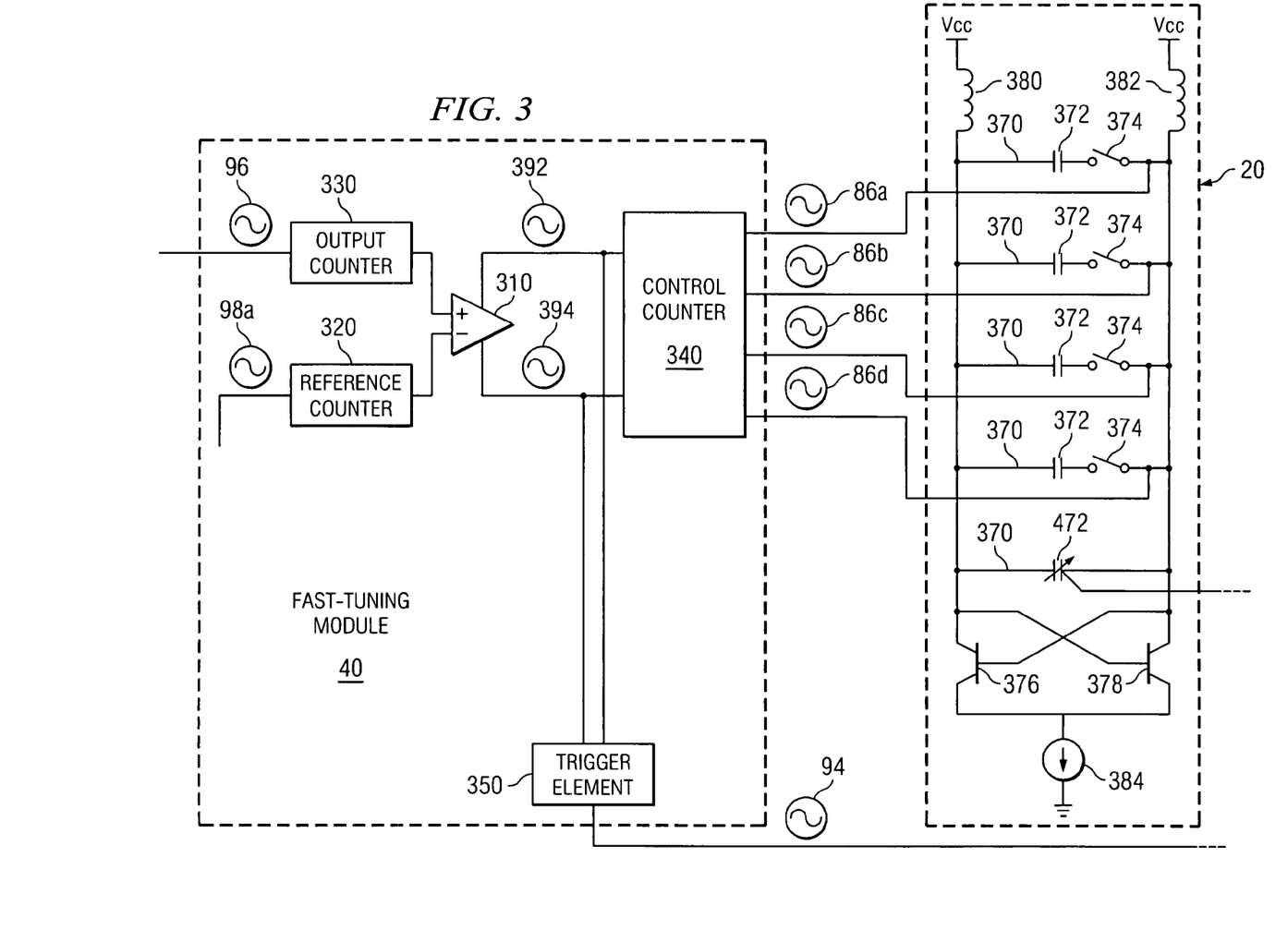
FIG. 3 illustrates the contents of a particular embodiment of a first tuning module that may be utilized in the frequency synthesizer of FIG. 1.

Alternatively or additionally, particular embodiments of fast-tuning module 40 may be configured to adjust the frequency of output signal 90 until fast-tuning module 40 determines that a particular change induced by fast-tuning module 40 should be followed by a change in the opposite direction. For example, in such embodiments, fast-tuning module 40 may continue to adjust the frequency of output signal 90 until fast-tuning module 40 determines that an increase in the frequency is appropriate following a decrease or that a decrease in the frequency is appropriate following an increase. At this point, in particular embodiments, fast-tuning module 40 may stop adjusting the frequency of output signal 90 and may transmit selection control signal 94 to selector 60 to instruct selector 60 to couple fine-tuning module 50 to oscillator 20. FIG. 2 illustrates this process in greater detail, while FIG. 3 illustrates a particular embodiment of fast-tuning module 40 configured to provide such functionality.

When fast-tuning module 40 determines that output signal 90 has a frequency equal to the requested frequency and/or within a predetermined range of the requested frequency, fast-tuning module 40 stops adjusting the frequency of the signal generated by oscillator 20. More specifically, in particular embodiments, fast-tuning module 40 may determine that the frequency of output signal 90 is within the relevant range of the requested frequency by comparing the frequency of divided signal 96 to the frequency of a reference signal 98a. Furthermore, the relevant range may be determined based on the magnitude of the changes that fast-tuning module 40 is configured to induce in the frequency of signals generated by oscillator 20. FIGS. 2 and 3 describe this process in greater detail.

Additionally, in response to determining that the frequency of output signal 90 is within the relevant range of the requested frequency, fast-tuning module 40 may transmit a selection control signal 94 to selector 60 instructing selector 60 to couple fine-tuning module 50 to oscillator 20. For example, in the illustrated embodiment, fast-tuning module 40 may transmit a selection control signal 94 to selector 60 instructing selector 60 to configure switch 62 so that fine-tuning module 50 is coupled to oscillator 20.

Once fine-tuning module 50 is coupled to oscillator 20, fine-tuning module 50 may begin adjusting the frequency of signals output by oscillator 20. Fine-tuning module 50 may continue to adjust the frequency of output signal 90 until fine-tuning module 50 determines that the frequency of output signal 90 is equal to, or substantially equal to, the requested frequency. For example, in particular embodiments, as described in greater detail below with respect to FIG. 3, fine-tuning module 50 may induce changes by adjusting the capacitance associated with oscillator 20.

Figure 4:
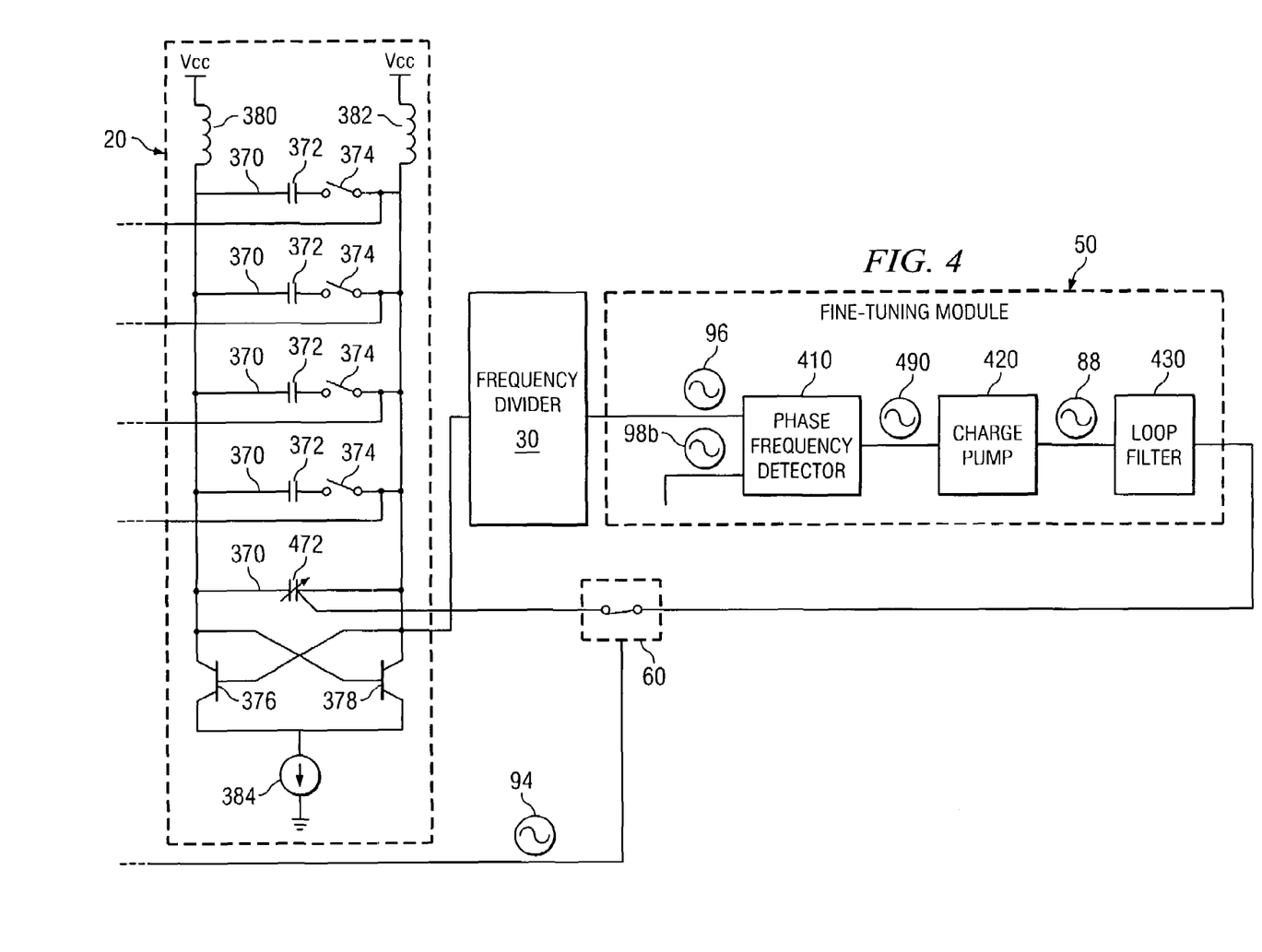
FIG. 4 illustrates the contents of a particular embodiment of a second tuning module that may be utilized in the frequency synthesizer of FIG. 1.

When fine-tuning module 50 determines that the frequency of output signal 90 is equal to (or, in particular embodiments, substantially equal to) the requested frequency, fine-tuning module 50 stops adjusting the frequency of the signal generated by oscillator 20. More specifically, in particular embodiments, fine-tuning module 50 may determine that the frequency of output signal 90 is within the relevant range of the requested frequency by comparing the frequency of divided signal 96 to the frequency of a reference signal 98b. FIGS. 2 and 4 describe this process in greater detail.

After fine-tuning module 50 determines that the frequency of output signal 90 is equal to the requested frequency and oscillator 20 has stabilized from any changes induced by fine-tuning module 50, devices coupled to frequency synthesizer 10 may utilize output signal 90 generated by frequency synthesizer 10. For example, in particular embodiments, a mixer (not shown) coupled to frequency synthesizer 10 may mix output signal 90 with a received RF signal to downconvert, upconvert, or otherwise convert the frequency of the received RF signal. The mixer and/or related components may be able to then isolate a particular channel within the frequency-converted signal.

Because changes induced by fine-tuning module 50 may take longer to take effect then changes induced by fast-tuning module 40 and/or frequency synthesizer 10 may take longer to stabilize following changes induced by fine-tuning module 50 than following changes induced by fast-tuning module 40, frequency synthesizer 10 may be able to tune the frequency of output signal 90 to the requested frequency faster using the combination of fast-tuning module 40 and fine-tuning module 50 than using fine-tuning module 50 alone. Additionally, in particular embodiments, tuning oscillator 20 may require less power consumption by using both fast-tuning module 40 and fine-tuning module 50 to tuning oscillator 20 than by using only fine-tuning module 50. As a result, particular embodiments of frequency synthesizer 10 may provide multiple operational benefits. Nonetheless, various embodiments of frequency synthesizer 10 and/or components incorporating frequency synthesizer 10 may exhibit some, none, or all of these benefits.

FIG. 2 is a chart illustrating an example of the operation of a particular embodiment of frequency synthesizer 10. More specifically, FIG. 2 illustrates the frequency of output signal 90 as fast-tuning module 40 and fine-tuning module 50 induce changes in the output frequency. In the illustrated example, fast-tuning module 40 continues to induce changes in the frequency of output signal 90 until fast-tuning module 40 determines that a particular change in the frequency of output signal 90 should be followed by a change in the opposite direction to bring the frequency closer to the requested frequency.

At the outset, in this example, the frequency of output signal 90 is assumed to be equal to frequency "$F_1$" as indicated by bar 110a in FIG. 2. Frequency synthesizer 10 receives divisor selection signal 92 that indicates a requested frequency of "$F_R$" illustrated in FIG. 2 as bar 120. Fast-tuning module 40 determines that the frequency of output signal 90 is less than the requested frequency and induces an increase in the frequency of output signal 90, as indicated by arrow 130a.

Following the increase, the frequency of output signal 90 is "$F_2$" MHz as illustrated in FIG. 2 by bar 110b. Fast-tuning module 40 again determines that an increase is needed to tune the frequency of output signal 90 to the requested frequency. Fast-tuning module 40 again increases the frequency of output signal 90 as indicated by arrow 130b and bar 110c. Fast-tuning module 40 continues to increase the frequency of output signal 90 as indicated by arrows 130c, 130d, and 130e connecting bar 110c to bar 110d, 110d to bar 110e, and bar 110e to bar 110f, respectively.

After increasing the frequency of output signal 90 to "$F_6$" (represented by bar 110f), fast-tuning module 40 determines that a decrease is necessary to move the frequency of output signal 90 closer to the requested frequency. Because the previous change was an increase, fast-tuning module 40 generates a selection control signal 94 instructing selector 60 to couple fine-tuning module 50 to oscillator 20. Fine-tuning module 50 then begins inducing changes in the frequency of output signal 90 as reflected by arrows 132a, 132b, and 132c. Following the change corresponding to arrow 132c, the frequency of output signal 90 is equal to the requested frequency and fine-tuning module 50 can stop adjusting the frequency of output signal 90.

FIG. 3 illustrates the contents and operation of particular embodiments of fast-tuning module 40 and oscillator 20. In the illustrated embodiment, fast-tuning module 40 includes a comparator 310, a reference counter 320, an output counter 330, a control counter 340, and a trigger element 350. In the illustrated embodiment, comparator 310 compares outputs of reference counter 320 and output counter 330. Control counter 340 and trigger element 350 then control the operation of oscillator 20 and selector 60, respectively, based on the results of this comparison. Comparator 310, reference counter 320, output counter 330, control counter 340, and trigger element 350 may each represent any appropriate component or combination of components suitable to provide the described functionality.

Additionally, in the illustrated embodiment, oscillator 20 includes a plurality of capacitive paths 370, each of which includes variable capacitor 472 or one or more capacitors 372 and a switch 374, a pair of transistors 376 and 378, a pair of inductors 380 and 382, and a current sink 384. Switches 374 are capable of selectively coupling their corresponding capacitive paths between transistors 376 and 378 based on one or more fast-tuning control signals 86 transmitted by control counter 340. In particular embodiments, such as the one illustrated in FIG. 3, capacitors 372 reflect a binary-weighted collection of capacitance values. As a result, the fast-tuning module 40 is capable of increasing or decreasing the capacitance coupling transistor 376 of oscillator 20 to transistor 378, and thus altering the frequency of output signal 90, by configuring switches 374.

In operation, output counter 330 receives divided signal 96 and counts particular types of edges in divided signal 96. Meanwhile, reference counter 320 receives a reference signal 98*a* having a predetermined frequency and counts particular types of edges in the reference signal 98*a*. For example, in particular embodiments, output counter 330 and reference counter 320 may be configured to count either rising edges or falling edges of the respective signals they receive.

Comparator 310 then compares the edge counts output by output counter 330 and reference counter 320. If comparator 310 determines that the count output by output counter 330 is less than the count output by reference counter 320, this indicates that divided signal 96 has a lower frequency than reference signal 98*a*. Moreover, this means that output signal 90 has a lower frequency than the requested frequency. If comparator 310 determines that the count output by output counter 330 is greater than the count output by reference counter 320, this indicates that divided signal has a greater frequency than reference signal 98*a*. Moreover, this means that output signal 90 has a greater frequency than the requested frequency. Comparator 310 then transmits information resulting from the comparison to control counter 340 and trigger element 350.

More specifically, in the illustrated example, comparator 310 outputs a two-bit value that includes a count output 392 and a mode output 394. Count output 392 indicates whether fast-tuning module 40 should induce a change in the current frequency of output signal 90. Mode output 394 indicates whether the change should be an increase or a decrease.

Control counter 340 outputs a count to oscillator 20 as one or more fast-tuning control signals 86. More specifically, in the illustrated embodiment, fast-tuning control counter 340 outputs a parallel, four-bit count as fast-tuning control signals 86*a-d*. Control counter 340 receives the output of comparator 310 and determines whether to adjust its output. In the illustrated example, control counter 340 determines based on count output 392 whether to adjust fast-tuning control signals 86 and determines based on mode output 394 whether to increment or decrement the count.

As shown in FIG. 3, fast-tuning control signals 86 are transmitted to oscillator 20 and are used by oscillator 20 to configure switches 374. As a result, in the illustrated embodiment, particular combinations of capacitive paths are coupled between transistors 376 and 378. More specifically, in the illustrated embodiment, oscillator 20 is configured so that fast-tuning control signals 86 induce an increasing capacitance between transistors 376 and 378 as the count maintained by control counter 340 increases. Similarly, oscillator 20 is configured so that fast-tuning control signals 86 induce a deceasing capacitance between transistors 376 and 378 as the count maintained by control counter 340 decreases. As a result, as fast-tuning module 40 increases or decreases the count of control counter 340, fast-tuning module 40 causes oscillator to step through a spectrum of frequencies associated with oscillator 20.

Additionally, trigger element 350 also receives count output 392 and mode output 394 from comparator 310 and may store a copy of either or both of count output 392 and mode output 394. As noted above, count output 392 indicates whether fast-tuning module 40 should induce a change in the current frequency of output signal 90. If count output 392 indicates that fast-tuning module 40 should not induce a change in the current frequency of output signal 90 then trigger element 350 may transmit control signals 94 to selector 60 to instruct selector 60 to couple fine-tuning module 50 to oscillator 20. Fine-tuning module 50 may then take over responsibility for adjusting the frequency of output signal 90. For example, in particular embodiments, a count output 392 of "0" indicates the fast-tuning module 40 should not induce any more changes to the frequency of output signal 90, and, thus, trigger element 350 may instruct selector 60 to couple fine-tuning module 50 to oscillator 20 when comparator 310 outputs a count output 392 of "0."

Additionally, if count output 392 indicates that fast-tuning module 40 should induce a change in the frequency of output signal 90, trigger element 350 then compares a current mode output 394 with the previous mode output 394 to determine whether the change to be induced by fast-tuning module 40 has changed direction. If so, trigger element 350 may similarly transmit selection control signal 94 to selector 60 to instruct selector 60 to couple fine-tuning module 50 to oscillator 20. Fine-tuning module 50 may then take over responsibility for adjusting the frequency of output signal 90.

FIG. 4 illustrates the contents and operation of a particular embodiment of fine-tuning module 50 and oscillator 20. In the illustrated embodiment, fine-tuning module 50 includes a phase frequency detector 410, a charge pump 420, and a loop filter 430. In the illustrated embodiment, phase frequency detector 410 compares the frequency of divided signal 96 to the frequency of reference signal 98*b* and adjusts the frequency of output signal 90 based on the results of this comparison through the operation of charge pump 420 and loop filter 430. Phase frequency detector 410, charge pump 420, and loop filter 430 may each represent any appropriate component or combination of components suitable to provide the described functionality.

In operation, phase frequency detector 410 compares the phase difference between an edge of divided signal 96 and a corresponding edge of reference signal 98*b*. For example, in particular embodiments, phase frequency detector 410 may determine the phase difference between a rising or falling edge of divided signal 96 and a rising or falling edge of reference signal 98*b*. Phase frequency detector 410 then outputs a phase correction signal 490 having a pulse width equal to the phase difference between the relevant edges.

Charge pump 420 then generates fine-tuning control signal 88 having a magnitude equal to the pulse width of phase correction signal 490. Charge pump 420 transmits fine-tuning control signal 88 to oscillator 20 through loop filter 430. In particular embodiments, loop filter 430 acts as a lowpass filter limiting the effects of transient variations in fine-tuning control signal. This may allow fine-tuning module 50 to induce and maintain precise changes in the frequency of output signal 90. As a result, loop filter 430 may, however, increase the amount of time required for fine-tuning module 50 to induce changes in the output frequency.

Oscillator 20 receives fine-tuning control signal 88 and adjusts the frequency of output signal 90 generated by oscillator 20. More specifically, in particular embodiments, oscillator 20 uses fine-tuning control signal 88 to adjust a capacitance of a variable capacitor 472 in oscillator 20. By increasing or decreasing the capacitance of variable capacitor 472, oscillator 20 can decrease or increase, respectively, the frequency of output signal 90.

As noted above, the configuration and contents of fine-tuning module 50 may result in fine-tuning control signal 88 inducing changes in the frequency of output signal 90 that are smaller in size than those induced by fast-tuning module 40, allowing more precise control of the frequency of output signal 90 when fine-tuning module 50 is coupled to oscillator 20. The contents and configuration of fine-tuning module 50, however, may also result fine-tuning control 88 taking longer to induce changes in oscillator 20. Thus, by using a combination of fast-tuning module 40 and fine-tuning module 50 to tune oscillator 20, frequency synthesizer 10 may be able to tune oscillator 20 more quickly.

Figure 5:
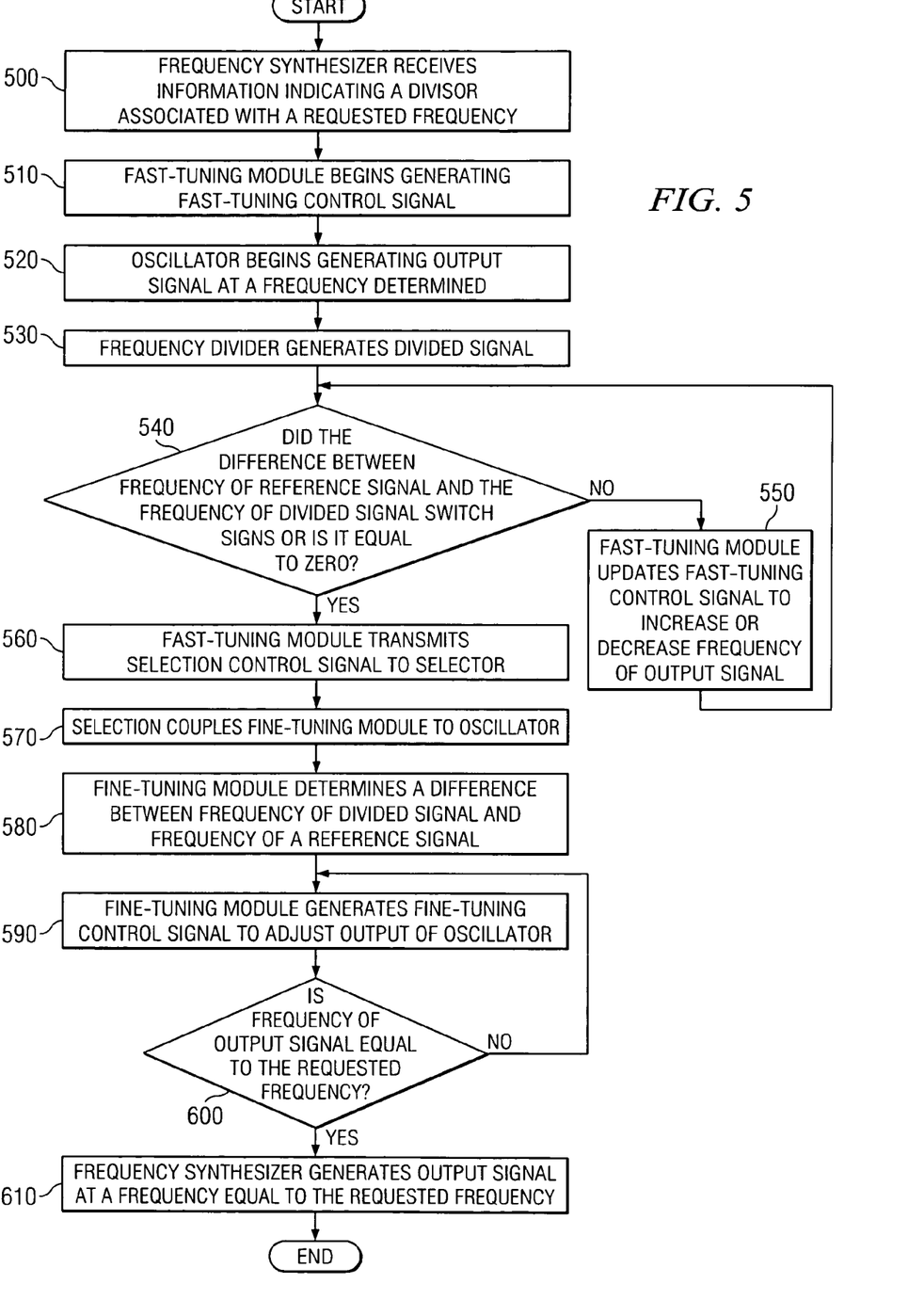
FIG. 5 is a flowchart illustrating operation of a particular embodiment of the frequency synthesizer of FIG. 1.

FIG. 5 is a flowchart illustrating an example of the operation of a particular embodiment of frequency synthesizer 10 in generating an output signal 90 having a particular frequency. Any or all of the steps illustrated in FIG. 5 may be combined, modified, or deleted where appropriate, and additional steps may also be added to the described process. Additionally, the illustrated steps may be performed in any suitable order without departing from the scope of the invention.

Operation begins at step 500, with frequency synthesizer 10 receiving information indicating a divisor associated with a requested frequency for frequency synthesizer 10 to output. For example, during operation of the embodiment illustrated in FIG. 1, frequency synthesizer 10 may receive a divisor selection signal 92. Frequency synthesizer 10 communicates this information to frequency divider 30 or to another component of frequency synthesizer 10 responsible for converting this information into a form appropriate for use by frequency divider 30.

At an appropriate point, represented in FIG. 5 by step 510, fast-tuning module 40 begins generating fast-tuning control signal 86. At step 520, oscillator 20 begins generating output signal 90 at a frequency determined based on fast-tuning control signal 86. Depending on the configuration of oscillator 20, fast-tuning module 40, and/or frequency synthesizer 10 as a whole, the initial frequency of output signal 90 may be set to a default frequency, to the last frequency requested of oscillator 20, or to any other appropriate frequency. At step 530, frequency divider 30 then generates a divided signal 96 having a frequency equal to the frequency of output signal 90 divided by a divisor determined based on divisor selection signal 92 or other appropriate information received by frequency divider 30.

Based on the frequency of divided signal 96 as received by fast-tuning module 40, fast-tuning module 40, at step 540, determines whether the difference between the frequency of reference signal 98a and the frequency of divided signal 96 has switched from a positive value to a negative value, from a negative value to a positive value, or from either a negative value or a positive value to zero. If so, at step 560, fast-tuning module 40 transmits a selection control signal 94 to selector 60 to cause selector 60 to couple fine tuning module 50 to oscillator 20 and operation continues at step 570. If not, at step 550, fast-tuning module 40 updates fast-tuning control signal 86 to increase or decrease, as appropriate, the frequency of output signal 90. Operation then returns to step 540.

At step 570, selector 60 couples fine-tuning module 50 to oscillator 20. Depending on the configuration of frequency synthesizer 10, in particular embodiments, selector 60 or another appropriate component of frequency synthesizer 10 may also decouple fast-tuning module 40 from oscillator 20. Fine-tuning module 50 then determines a difference between the frequency of divided signal 96 and the frequency of reference signal 98b at step 580. At step 590, fine-tuning module 50 then generates a fine-tuning control signal 88 that adjusts oscillator 30 so that the frequency of output signal 90 is equal to and/or within a predetermined range of the requested frequency. Depending on the configuration of frequency synthesizer 10, fine-tuning module 50 may achieve this by generating a fine-tuning control signal 88 that increases or decreases the frequency of output signal 90 to the requested frequency with a single increase or decrease. Alternatively, fine-tuning module 50 may induce a series of increases or decreases in the frequency of output signal 90, continuing to increase or decrease the frequency until fine-tuning module 50 determines, at step 600, that the frequency of output signal 90 is equal to the requested frequency (based on the comparison of divided signal 96 and reference signal 98b). As a result, operation of frequency synthesizer 10 may return to step 590 repeatedly until the frequency of output signal 90 equals the requested frequency, as shown in FIG. 5. At step 610, frequency synthesizer 10 may then generate output signal 90 at a frequency equal to or within a predetermined range of the requested frequency. This may end the tuning process of frequency synthesizer 10, as shown in FIG. 5.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. An apparatus for generating an output signal having a particular frequency, comprising:
    an oscillator operable to generate an output signal associated with an output frequency;
    a first tuning module operable, when coupled to the oscillator, to induce changes in the output frequency, wherein the first tuning module is operable to induce changes in the output frequency of a particular magnitude within a first amount of time;
    a second tuning module operable, when coupled to the oscillator, to induce changes in the output frequency, wherein the second tuning module is operable to induce changes in the output frequency of the particular magnitude within a second amount of time, wherein the second amount of time is greater than the first amount of time;
    a frequency divider operable to:
        receive information indicating a divisor associated with a requested frequency;
        generate a divided signal, wherein the divided signal is associated with a frequency equal to the output frequency divided by the divisor; and
    a selector operable to couple at least a selected one of the first tuning module and the second tuning module to the oscillator based, at least in part, on a difference between the divided signal and a reference signal;
    wherein the first tuning module comprises:
        a first counter operable to count a quantity of edges in the divided signal;

a second counter operable to count a quantity of edges in a reference signal;

a comparator operable to compare a first count output by the first counter to a second count output by the second counter; and a trigger element operable to store a first output of the comparator; and wherein the first tuning module is operable to:

increase the output frequency associated with the output signal if the first count is less than the second count; and decrease the output frequency associated with the output signal if the first count is greater than the second count; and wherein the selector is operable to:

couple the second tuning module to the oscillator if the first count is equal to the second count; and couple the second tuning module to the oscillator based, at least in part, on the stored first output and a second output of the comparator.

2. The apparatus of claim 1, wherein:

the first counter is operable to count a quantity of edges in the divided signal by counting a quantity of rising edges in the divided signal; and the second counter is operable to count a quantity of edges in the reference signal by counting a quantity of rising edges in the reference signal.

3. The apparatus of claim 1, wherein:

the first counter is operable to count a quantity of edges in the divided signal by counting a quantity of falling edges in the divided signal; and the second counter is operable to count a quantity of edges in the reference signal by counting a quantity of falling edges in the reference signal.

4. The apparatus of claim 1, wherein the comparator is further operable to generate:

a mode output indicating a direction of a count;

a count change output indicating whether the count should be adjusted; and wherein the trigger element is operable to detect a transition in the mode output from a first level to a second level, and wherein the selector is operable to couple the selected module to the oscillator based, at least in part, on the transition in the mode output.

5. The apparatus of claim 4, further comprising:

a first transistor;

a second transistor;

a plurality of capacitive paths, each capacitive path associated with a capacitance;

a plurality of switches, each of the switches operable to selectively couple the first transistor to the second transistor through a particular capacitive path; and a third counter operable to count a number times the comparator outputs the count change output at a particular level, and wherein the first control module is operable to configure the plurality of switches to couple the first transistor to the second transistor through one or more of the capacitive paths.

6. The apparatus of claim 1, wherein the oscillator comprises a variable capacitor and wherein the second tuning module is operable, when the second tuning module is coupled to the oscillator, to induce changes in the output frequency by adjusting a capacitance associated with the variable capacitor.

7. The apparatus of claim 6, wherein the second tuning module comprises:

a phase frequency detector;

a charge pump; and a loop filter.

8. The apparatus of claim 1, wherein the first tuning module is operable to induce a change of a particular magnitude in the output frequency within a first period of time and the second tuning module is operable to induce the same change within a second period of time.

9. A method for generating an output signal having a particular frequency, comprising:

receiving information indicating a divisor associated with a requested frequency;

generating, at an oscillator, an output signal, wherein the output signal is associated with an output frequency; and generating a divided signal, wherein the divided signal is associated with a frequency equal to the output frequency divided by a divisor;

selectively coupling at least one of a first tuning module and a second tuning module to the oscillator based, at least in part, on a difference between the divided signal and a reference signal, wherein:

the first tuning module is operable, when coupled to the oscillator, to induce changes in the output frequency, wherein the first tuning module is operable to induce changes in the output frequency of a particular magnitude within a first amount of time;

the second tuning module is operable, when coupled to the oscillator, to induce changes in the output frequency, wherein the second tuning module is operable to induce changes in the output frequency of the particular magnitude within a second amount of time, wherein the second amount of time is greater than the first amount of time;

counting, with a first counter, a quantity of edges in the divided signal;

counting, with a second counter, a quantity of edges in a reference signal;

comparing, with a comparator, a first count output by the first counter to a second count output by the second counter;

increasing a capacitance associated with the oscillator if the first count is greater than the second count;

decreasing a capacitance associated with the oscillator if the second count is greater than the first count; and storing a first output of the comparator;

wherein selectively coupling at least one of the first tuning module and the second tuning module to the oscillator comprises, at least one of:

coupling the second tuning module to the oscillator if the first count is equal to the second count; and selectively coupling at least one of the first tuning module and the second tuning module to the oscillator based, at least in part, on the stored first output and a second output of the comparator.

10. The method of claim 9, wherein:

counting the quantity of edges in the divided signal comprises counting a quantity of rising edges in the divided signal; and counting the quantity of edges in the reference signal comprises counting a quantity of rising edges in the reference signal.

11. The method of claim 9, wherein:
counting the quantity of edges in the divided signal comprises counting a quantity of falling edges in the divided signal; and
counting the quantity of edges in the reference signal comprises counting a quantity of falling edges in the reference signal.

12. The method of claim 9, further comprising generating based, at least in part, on a comparison of the first count and the second count:
a count change output indicating a change in a magnitude of an attempt count;
a mode output indicating a direction of the change in magnitude of the attempt count; and wherein selectively coupling at least one of the first tuning module and the second tuning module to the oscillator comprises selectively coupling at least one of the first tuning module and the second tuning module to the oscillator based, at least in part, on a transition of the mode output from a first level to a second level.

13. The method of claim 12, further comprising:
counting, with a third counter, a number of times the comparator outputs the count change output at a particular level,
configuring, based on the output of the third counter, one or more of a plurality of switches, wherein each of the plurality of switches is operable to selectively couple a first transistor to a second transistor through a capacitive path having a particular capacitance.

14. The method of claim 9, further comprising inducing changes in the output frequency, when the second tuning module is coupled to the oscillator, by adjusting a capacitance associated with a variable capacitor in the second tuning module.

15. An apparatus for generating an output signal having a particular frequency, comprising:
an oscillator operable to generate an output signal associated with an output frequency;
a first tuning module operable, when coupled to the oscillator, to induce changes in the output frequency, wherein the first tuning module is operable to induce changes in the output frequency of a particular magnitude within a first amount of time;
a second tuning module operable, when coupled to the oscillator, to induce changes in the output frequency, wherein the second tuning module is operable to induce changes in the output frequency of the particular magnitude within a second amount of time, wherein the second amount of time is greater than the first amount of time;
a frequency divider operable to:
receive information indicating a divisor associated with a requested frequency;
generate a divided signal, wherein the divided signal is associated with a frequency equal to the output frequency divided by the divisor; and
a selector operable to couple at least a selected one of the first tuning module and the second tuning module to the oscillator based, at least in part, on a difference between the divided signal and a reference signals;
wherein the first tuning module comprises:
a comparator operable to compare a first count associated with a quantity of edges in the divided signal and a second count associated with a quantity of edges in a reference signal; and
a memory operable to store a first output of the comparator; and
wherein the selector is operable to couple the second tuning module to the oscillator based, at least in part, on the stored first output and a second output of the comparator.

* * * * *